(12) United States Patent
Koike

(10) Patent No.: US 8,907,387 B2
(45) Date of Patent: Dec. 9, 2014

(54) SOLID-STATE IMAGING DEVICE AND MANUFACTURING METHOD THEREOF

(75) Inventor: Hidetoshi Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 13/423,382

(22) Filed: Mar. 19, 2012

(65) Prior Publication Data
US 2012/0299071 A1 Nov. 29, 2012

(30) Foreign Application Priority Data

May 24, 2011 (JP) ................... 2011-116188

(51) Int. Cl.
H01L 31/062 (2012.01)
H01L 31/113 (2006.01)
H01L 27/146 (2006.01)

(52) U.S. Cl.
CPC ...... *H01L 27/14616* (2013.01); *H01L 27/1461* (2013.01); *H01L 27/14643* (2013.01); *H01L 27/14689* (2013.01)
USPC .............................. 257/292; 257/233; 438/60

(58) Field of Classification Search
USPC .......... 257/E27.133, 79, 80, 83, 84, 292, 233, 257/290, 293, 314, 298, 299, 272, 225, 229, 257/230; 438/57, 60, 179, 286, 48
See application file for complete search history.

(56) References Cited

U.S. PATENT DOCUMENTS

| 8,169,523 | B2 * | 5/2012 | Itonaga | .......................... 348/308 |
| 2001/0006237 | A1 | 7/2001 | Abe | |
| 2003/0025160 | A1 | 2/2003 | Suzuki et al. | |
| 2003/0096443 | A1 | 5/2003 | Hwang | |
| 2009/0200580 | A1 | 8/2009 | Rhodes et al. | |
| 2009/0303371 | A1 * | 12/2009 | Watanabe et al. | ............. 348/311 |
| 2009/0322919 | A1 * | 12/2009 | Itonaga | ......................... 348/294 |
| 2011/0079868 | A1 | 4/2011 | Koike | |

FOREIGN PATENT DOCUMENTS

| CN | 101609837 A | 12/2009 |
| CN | 101615621 A | 12/2009 |
| JP | 2003-282857 A | 10/2003 |
| JP | 2008-066480 A | 3/2008 |
| JP | 2010-239075 | 10/2010 |
| KR | 10-0436067 | 6/2004 |
| TW | 201003907 A1 | 1/2010 |
| TW | 201017732 A1 | 5/2010 |

OTHER PUBLICATIONS

Notification for Filing Opinion issued May 14, 2013 in Korean Patent Application No. 10-2012-24954 (with English translation).

(Continued)

*Primary Examiner* — Thanh Y Tran
(74) *Attorney, Agent, or Firm* — Oblon, Spivak, McClelland, Maier & Neustadt, L.L.P.

(57) ABSTRACT

According to one embodiment, a solid-state imaging device includes a photodiode includes an N-type region and a P-type region, a floating diffusion region, and a transfer transistor. The N-type diffusion region of the photodiode comprises a first semiconductor region and a second semiconductor region formed shallower than the first semiconductor region. An end portion of the first semiconductor region is positioned on the floating diffusion region side rather than an end portion of a gate electrode of the transfer transistor. An end portion of the second semiconductor region is set in substantially the same position as that of the end portion of the gate electrode of the transfer transistor.

6 Claims, 2 Drawing Sheets

(56) References Cited

OTHER PUBLICATIONS

Combined Taiwanese Office Action and Search Report issued Mar. 12, 2014 in Patent Application No. 101107898 (with English language translation of the Office Action and English translation of categories of cited documents).

Combined Chinese Office Action and Search Report issued Jun. 4, 2014 in Patent Application No. 201210067578.X (with partial English translation and English translation of categories of cited documents).

Office Action issued May 20, 2014 in Japanese Patent Application No. 2011-116188 (with English language translation).

* cited by examiner

F I G. 1
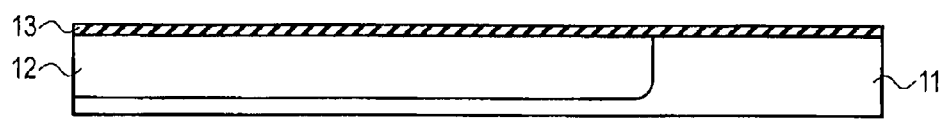
F I G. 2
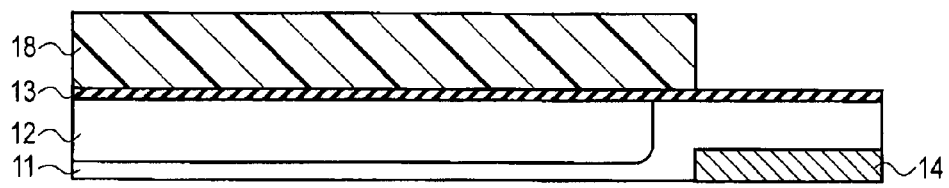
F I G. 3
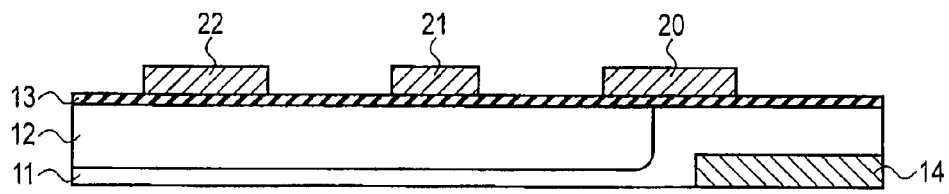
F I G. 4

SOLID-STATE IMAGING DEVICE AND MANUFACTURING METHOD THEREOF

CROSS-REFERENCE TO RELATED APPLICATIONS

This application is based upon and claims the benefit of priority from prior Japanese Patent Application No. 2011-116188, filed May 24, 2011, the entire contents of which are incorporated herein by reference.

FIELD

Embodiments described herein relate generally to a solid-state imaging device and a manufacturing method thereof.

BACKGROUND

As a solid-state imaging device, for example, a CMOS image sensor is known. The CMOS image sensor amplifies a pixel signal detected by a photodiode for each cell configuring one pixel by means of a transistor. In the CMOS image sensor, a dynamic shift register is used as a circuit that horizontally or vertically scans an imaging unit having pixels arranged in a two-dimensional form and an attempt is made to simplify and miniaturize the circuit and reduce the power consumption thereof.

With miniaturization of the CMOS image sensor, the pixel is further miniaturized. A method for performing an ion-implanting process in a self-alignment manner after a gate electrode of a transfer transistor is formed in order to precisely form an N-type region and P-type region that configures a photodiode with respect to the transfer transistor when the pixels are miniaturized.

Since impurity ions are implanted into a semiconductor substrate with high acceleration energy (for example, 150 keV or more) when impurity ions are implanted in a self-alignment manner with respect to the gate electrode to form the N-type region of the photodiode, the impurity ions penetrate through the gate electrode formed of polysilicon to reach the semiconductor substrate. In order to prevent the impurity ions from reaching the semiconductor substrate lying directly under the gate electrode, it is necessary to form a cap member on the gate electrode and prevent the impurity ions from penetrating through the gate electrode. However, since a cap member is not required when logic transistors are formed in a surrounding portion of the pixel, a cap member is required only for the transistor configuring the pixel. As a result, the manufacturing process becomes complicated and the cost of the CMOS image sensor is raised.

BRIEF DESCRIPTION OF THE DRAWINGS

FIG. 1 is a cross-sectional view showing a manufacturing step of a solid-state imaging device according to the present embodiment;

FIG. 2 is a cross-sectional view showing a manufacturing step of the solid-state imaging device following after the step of FIG. 1;

FIG. 3 is a cross-sectional view showing a manufacturing step of the solid-state imaging device following after the step of FIG. 2;

FIG. 4 is a cross-sectional view showing a manufacturing step of the solid-state imaging device following after the step of FIG. 3;

DETAILED DESCRIPTION

Figure 5:
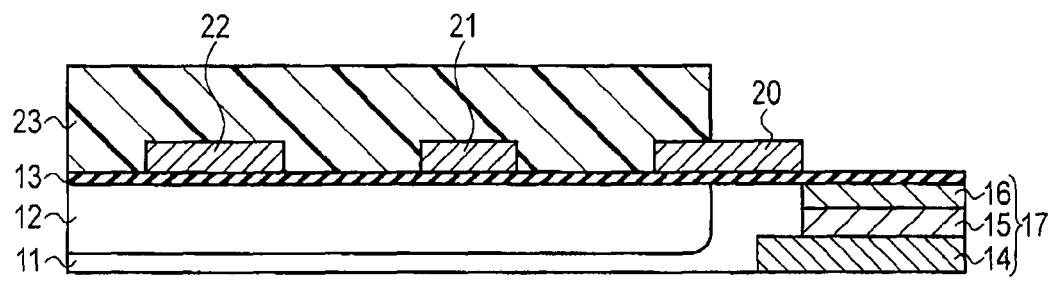
FIG. 5 is a cross-sectional view showing a manufacturing step of the solid-state imaging device following after the step of FIG. 4.

In general, according to one embodiment, there is provided a solid-state imaging device comprising:
a semiconductor substrate;
a photodiode provided in the semiconductor substrate and comprising an N-type region and a P-type region;
a floating diffusion region provided in the semiconductor substrate to hold charges transferred from the photodiode; and
a transfer transistor provided on the semiconductor substrate to transfer charges stored in the photodiode to the floating diffusion region,
wherein the N-type region of the photodiode comprises a first semiconductor region and a second semiconductor region formed shallower than the first semiconductor region,
an end portion of the first semiconductor region is positioned on the floating diffusion region side rather than an end portion of a gate electrode of the transfer transistor, and
an end portion of the second semiconductor region is set in substantially the same position as that of the end portion of the gate electrode of the transfer transistor.

The embodiments will be described hereinafter with reference to the accompanying drawings. In the description which follows, the same or functionally equivalent elements are denoted by the same reference numerals, to thereby simplify the description.

The manufacturing method and the structure of a solid-state imaging device according to the present embodiment are explained below. The solid-state imaging device of this embodiment is configured by a CMOS image sensor, for example.

FIG. 1 is a cross-sectional view showing the manufacturing step of the solid-state imaging device according to the present embodiment. First, a semiconductor substrate 11 is prepared. As the semiconductor substrate 11, for example, a P-type epitaxial substrate formed of silicon (Si) is used. Then, P-type impurities are partly injected into the semiconductor substrate 11 to form a P-type well 12 in a partial region (transistor region) of the semiconductor substrate 11. On the transistor region, a plurality of MOSFETs (Metal Oxide Semiconductor Field Effect Transistors) configuring pixels are formed.

Next, as shown in FIG. 2, a gate insulating film 13 for MOSFETs is formed on the semiconductor substrate 11. As the gate insulating film 13, for example, a silicon oxide film with a thickness of 4 nm or more is used.

Subsequently, as shown in FIG. 3, a resist layer 18 is formed on the gate insulating film 13 by use of a lithography process to expose only a photodiode region of the semiconductor substrate 11 on which a photodiode 17 configuring a pixel is formed. The photodiode region is arranged outside the P-type well 12.

Next, N-type impurities are ion-implanted into the semiconductor substrate 11 with the resist layer 18 used as a mask to form an N-type semiconductor region 14 configuring a photodiode 17 in the semiconductor substrate 11. The N-type semiconductor region 14 is formed by ion-implanting impurities with high acceleration energy (for example, 200 keV or more). The depth of peak impurity concentration of the N-type semiconductor region 14 is approximately 0.25 μm. In the embodiment, a depth of peak impurity concentration is a value measured from the upper surface of the semiconductor substrate 11. In the formation process of the N-type semiconductor region 14, the gate electrode for MOSFETs is not formed and the process is not performed in a self-alignment manner by using the gate electrode as a mask. Further, in the formation process of the N-type semiconductor region 14, since a region other than the photodiode region is covered with the resist layer 14, an ion-implantation process using high acceleration energy can be performed. After this, the resist layer 14 is removed.

Then, as shown in FIG. 4, a gate electrode 20 for a transfer transistor, a gate electrode 21 for a reset transistor and a gate electrode 22 for an amplification transistor are simultaneously formed. As the gate electrodes 20 to 22, for example, conductive polysilicon is used. The transfer transistor transfers charges (for example, electrons) stored in the photodiode 17 to a floating diffusion region 25 that will be described later in response to a transfer signal supplied to the gate thereof. The reset transistor resets a voltage of the floating diffusion region 25 to a power supply voltage in response to a reset signal supplied to the gate thereof. The amplification transistor amplifies the voltage of the floating diffusion region 25 and outputs the amplified voltage to a signal line (not shown) as a signal voltage.

Next, as shown in FIG. 5, a resist layer 23 is formed on the gate insulating film 13 and gate electrodes 20 to 22 by using the lithography process to cover the P-type well 12 (transistor region). The resist layer 23 is formed to partly cover the gate electrode 20 in order to form an N-type semiconductor region 15 configuring the photodiode 17 in a self-alignment manner with the gate electrode 20 used as a mask.

Then, N-type impurities are ion-implanted into the semiconductor substrate 11 with the resist layer 23 and gate electrode 20 used as a mask to form an N-type semiconductor region 15 configuring the photodiode 17 in a self-alignment manner in the semiconductor substrate 11. The N-type semiconductor region 15 is formed by ion-implanting impurities with a lower acceleration energy (for example, 50 keV or less) than that used at the ion-implantation time of the N-type semiconductor region 14 and prevents impurity ions from penetrating through the gate electrode 20 and reaching the semiconductor substrate 11. The depth of peak impurity concentration of the N-type semiconductor region 15 is approximately 0.06 μm. Thus, the N-type semiconductor region 15 is formed at a shallower depth than the N-type semiconductor region 14. In other words, the depth of peak impurity concentration of the N-type semiconductor region 15 is set shallower than the depth of peak impurity concentration of the N-type semiconductor region 14.

Next, P-type impurities are ion-implanted into the semiconductor substrate 11 with the resist layer 23 and gate electrode 20 used as a mask to form a P-type semiconductor region 16 configuring the photodiode 17 in a self-alignment manner in the semiconductor substrate 11. The P-type semiconductor region 16 is formed in the surface area of the semiconductor substrate 11 and the P-type semiconductor region 16 is formed shallower in depth than the N-type semiconductor region 15. In other words, the depth of peak impurity concentration of the P-type semiconductor region 16 is set shallower than the depth of peak impurity concentration of the N-type semiconductor region 15. Thus, the photodiode 17 is configured by the N-type semiconductor region 14, N-type semiconductor region 15 and P-type semiconductor region 16 formed in this order from the deeper side of the semiconductor substrate 11. After this, the resist layer 23 is removed.

As described before, the N-type semiconductor region 15 and P-type semiconductor region 16 that configure the photodiode 17 are formed in a self-alignment manner by using the gate electrode 20 as a mask. Therefore, the end portions of the N-type semiconductor region 15 and P-type semiconductor region 16 are substantially aligned with the end portion of the gate electrode 20. In an actual product, since impurities are thermally diffused even if the N-type semiconductor region 15 and P-type semiconductor region 16 are formed in a self-alignment manner, the end portions of the N-type semiconductor region 15 and P-type semiconductor region 16 slightly extend beneath the gate electrode 20. On the other hand, the gate electrode 20 is not formed when the N-type semiconductor region 14 is formed, and therefore, the N-type semiconductor region 14 is not formed in a self-alignment manner. As a result, the end portion of the N-type semiconductor region 14 is not aligned with the end portion of the gate electrode 20 and, for example, it extends beneath the gate electrode 20. Further, the end portion of the N-type semiconductor region 14 is not aligned with the end portions of the N-type semiconductor region 15 and P-type semiconductor region 16.

Figure 6:
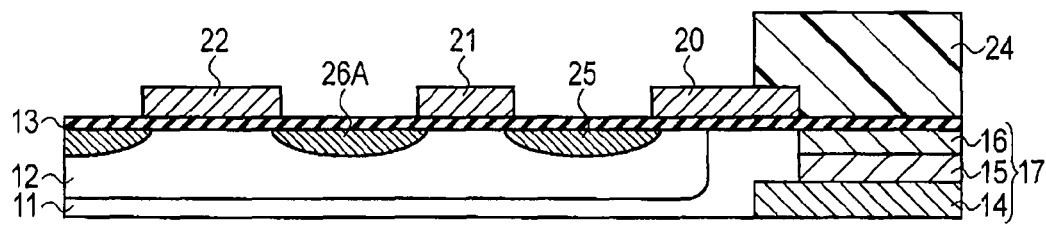
FIG. 6 is a cross-sectional view showing a manufacturing step of the solid-state imaging device following after the step of FIG. 5.

Next, as shown in FIG. 6, a resist layer 24 is formed on the gate insulating film 13 and gate electrode 20 to cover the photodiode 17 by use of the lithography process. Then, N-type impurities of low concentration are ion-implanted into the P-type well 12 in a self-alignment manner with the resist layer 24 used as a mask. As a result, a floating diffusion region 25 is formed in the P-type well 12 between the gate electrodes 20 and 21 and a low-concentration diffusion region 26A for a MOSFET is formed in the P-type well 12. The floating diffusion region 25 has a function of temporarily holding charges transferred from the photodiode 17.

Figure 7:
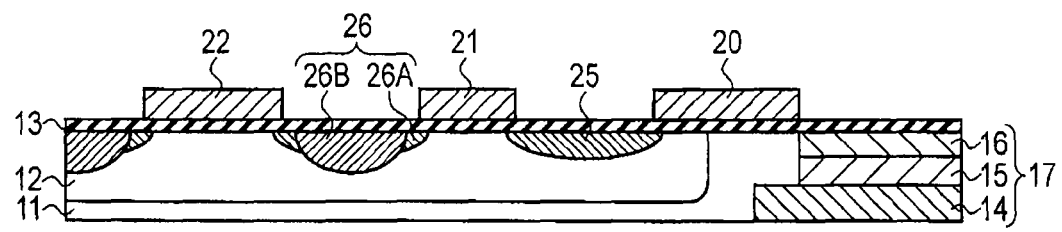
FIG. 7 is a cross-sectional view showing a manufacturing step of the solid-state imaging device following after the step of FIG. 6.

Subsequently, a resist layer (not shown) that covers the photodiode 17 and floating diffusion region 25 is formed. Then, as shown in FIG. 7, N-type impurities of high concentration are ion-implanted into the P-type well 12 in a self-alignment manner. As a result, a high-concentration diffusion region 26B for a MOSFET is formed in the P-type well 12. The diffusion region 26A and diffusion region 26B act as a source/drain region 26 of a MOSFET.

After this, contacts, wiring layers and a passivation film (not shown) are formed. Finally, a color filter and micro-lens (not shown) are formed in the pixel region to complete a solid-state imaging device.

(Effect)

As described above, in this embodiment, the photodiode 17 is configured by the N-type semiconductor region 14, N-type semiconductor region 15 and P-type semiconductor region 16 formed in this order from the deeper side of the semiconductor substrate 11. The N-type semiconductor region 14 is formed by ion-implanting impurities into the semiconductor substrate 11 with high acceleration energy (for example, 200 key or more) with the resist layer 23 used as a mask before the gate electrode 20 for the MOSFET is formed. As a result, since the N-type semiconductor region 14 is formed in a deep region of the semiconductor substrate 11, a distance between the N-type semiconductor region 14 and the floating diffusion region 25 can be set sufficiently long. As a result, a problem that the N-type semiconductor region 14 and floating diffusion region 25 are set excessively close to each other and the transfer transistor cannot be cut off can be solved.

Since the N-type semiconductor region 14 is not formed in a self-alignment manner, the N-type semiconductor region 14 extends beneath the gate electrode 20 of the transfer transistor. That is, there occurs a possibility that the end portion of the N-type semiconductor region 14 may be positioned on the side of the floating diffusion region 25 rather than the end portion side of the gate electrode 20. However, since the N-type semiconductor region 14 is formed sufficiently deeper, the N-type semiconductor region 14 and floating diffusion region 25 are not set excessively close to each other and the cutoff characteristic of the transfer transistor can be prevented from being degraded.

Further, the N-type semiconductor region 15 is formed by ion-implanting impurities with low acceleration energy (for example, 50 keV or less) in the semiconductor substrate 11 with the gate electrode 20 used as a mask after the gate electrode 20 of the transfer transistor is formed. Therefore, impurity ions can be prevented from penetrating through the gate electrode 20 and reaching the semiconductor substrate 11 by use of only the gate electrode 20 formed of polysilicon. Therefore, it is not necessary to form a cap layer that prevents impurity ions from penetrating through the gate electrode 20 on the gate electrode 20. Thus, transistors configuring pixels can be formed by use of the same manufacturing process as that for logic transistors in a surrounding portion of the pixels. As a result, the manufacturing process can be simplified and a problem of increasing the cost of the solid-state imaging device can be solved.

Since the N-type semiconductor region 15 is formed in a self-alignment manner, the end portion of the N-type semiconductor region 15 is set in substantially the same position as that of the end portion of the gate electrode 20 of the transfer transistor. Therefore, the N-type semiconductor region 15 and floating diffusion region 25 are not set excessively close to each other and the cutoff characteristic of the transfer transistor can be prevented from being degraded.

Further, since the N-type semiconductor region 15 and P-type semiconductor region 16 are formed in a self-alignment manner, the photodiode 17 can be formed with high precision even when the pixels are miniaturized. As a result, a solid-state imaging device having a desired characteristic can be realized.

In this embodiment, since the volume of the N-type region (N-type semiconductor regions 14 and 15) of the photodiode 17 can be made large, it becomes possible to store a large amount of charges in the photodiode 17. As a result, a solid-state imaging device with excellent image quality can be realized.

In this embodiment, an example in which the CMOS image sensor is used as the solid-state imaging device is explained, but a CCD image sensor can also be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
    a semiconductor substrate;
    a photodiode provided in the semiconductor substrate and comprising an N-type region and a first P-type region;
    a floating diffusion region provided in the semiconductor substrate to hold charges transferred from the photodiode; and
    a transfer transistor provided on the semiconductor substrate to transfer charges stored in the photodiode to the floating diffusion region,
    wherein the N-type region of the photodiode comprises a first semiconductor region and a second semiconductor region formed shallower than the first semiconductor region,
    an end portion of the first semiconductor region is positioned on the floating diffusion region side rather than an end portion of a gate electrode of the transfer transistor, and
    an end portion of the second semiconductor region is set in substantially the same position as that of the end portion of the gate electrode of the transfer transistor, and
    a region above the end portion of the first semiconductor region and on the floating diffusion region side of the end portion of the second semiconductor region is a second P-type region of the semiconductor substrate.

2. The device of claim 1, wherein an end portion of the first P-type region of the photodiode is set in substantially the same position as that of the end portion of the gate electrode of the transfer transistor.

3. The device of claim 1, wherein a depth of peak impurity concentration of the second semiconductor region is shallower than a depth of peak impurity concentration of the first semiconductor region.

4. The device of claim 1, wherein a depth of peak impurity concentration of the first P-type region is shallower than a depth of peak impurity concentration of the second semiconductor region.

5. The device of claim 1, wherein the second semiconductor region is formed in a self-alignment with the gate electrode of the transfer transistor used as a mask.

6. The device of claim 1, wherein the first P-type region is formed in a self-alignment with the gate electrode of the transfer transistor used as a mask.

* * * * *